(12) United States Patent
Ishiwata et al.

(10) Patent No.: US 8,526,222 B2
(45) Date of Patent: Sep. 3, 2013

(54) MAGNETIC RANDOM ACCESS MEMORY

(75) Inventors: Nobuyuki Ishiwata, Tokyo (JP); Hideaki Numata, Tokyo (JP); Norikazu Ohshima, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/606,737

(22) Filed: Sep. 7, 2012

(65) Prior Publication Data
US 2012/0326254 A1    Dec. 27, 2012

Related U.S. Application Data

(62) Division of application No. 12/297,153, filed as application No. PCT/JP2007/057839 on Apr. 9, 2007, now Pat. No. 8,351,249.

(30) Foreign Application Priority Data

Apr. 11, 2006  (JP) ................................ 2006-108480

(51) Int. Cl.
*G11C 11/15*    (2006.01)

(52) U.S. Cl.
USPC .......................................... 365/158; 365/171

(58) Field of Classification Search
USPC ................. 365/158, 171, 173; 257/421, 422, 257/469, E29.323
See application file for complete search history.

(56) References Cited

U.S. PATENT DOCUMENTS

| | | | |
|---|---|---|---|
| 6,767,655 B2 | 7/2004 | Hiramoto et al. | |
| 6,771,534 B2 * | 8/2004 | Stipe | 365/158 |
| 6,781,871 B2 | 8/2004 | Park et al. | |
| 7,064,934 B2 | 6/2006 | Mao et al. | |
| 7,929,342 B2 | 4/2011 | Numata et al. | |
| 7,936,627 B2 | 5/2011 | Fukami | |
| 8,023,315 B2 | 9/2011 | Fukami | |
| 2002/0055016 A1 | 5/2002 | Hiramoto et al. | |
| 2003/0117837 A1 | 6/2003 | Park et al. | |
| 2004/0252414 A1 | 12/2004 | Mao et al. | |

(Continued)

FOREIGN PATENT DOCUMENTS

| | | |
|---|---|---|
| JP | 2005-004942 | 1/2005 |
| JP | 2005-93488 | 4/2005 |

(Continued)

OTHER PUBLICATIONS

K. Yagami et al. Research Trends in Spin Transfer Magnetization Switching, vol. 28, No. 9, 2004, pp. 937-947.

(Continued)

*Primary Examiner* — Douglas King
(74) *Attorney, Agent, or Firm* — Young & Thompson

(57) ABSTRACT

A magnetic random access memory according to the present invention is provided with: a magnetic recording layer including a magnetization free region having a reversible magnetization, wherein a write current is flown through the magnetic recording layer in an in-plane direction; a magnetization fixed layer having a fixed magnetization; a non-magnetic layer provided between the magnetization free region and the magnetization fixed layer; and a heat sink structure provided to be opposed to the magnetic recording layer and having a function of receiving and radiating heat generated in the magnetic recording layer. The magnetic random access memory thus-structured radiates heat generated in the magnetic recording layer by using the heat sink structure, suppressing the temperature increase caused by the write current flown in the in-plane direction.

3 Claims, 20 Drawing Sheets

(56) References Cited

U.S. PATENT DOCUMENTS

| | | |
|---|---|---|
| 2006/0017126 A1 | 1/2006 | Bhattacharyya et al. |
| 2006/0227466 A1 | 10/2006 | Yamagi |
| 2007/0058422 A1 | 3/2007 | Phillips et al. |
| 2010/0002501 A1 | 1/2010 | Leuschner et al. |
| 2010/0046288 A1 | 2/2010 | Honjou et al. |

FOREIGN PATENT DOCUMENTS

| | | |
|---|---|---|
| JP | 2005-123617 | 5/2005 |
| JP | 2005-150303 | 6/2005 |
| JP | 2005-191032 | 7/2005 |
| JP | 2006-73930 | 3/2006 |
| JP | 2006-93578 | 4/2006 |
| JP | 2007-258460 | 10/2007 |
| JP | 2007-317895 | 12/2007 |
| WO | 2007/020823 | 2/2007 |
| WO | 2008/068967 | 6/2008 |

OTHER PUBLICATIONS

A. Yamaguchi et al., Real Space Observation of Current-Driven Domain Wall Motion in Submicron Magnetic Wires, vol. 92, No. 7, Feb. 2004, pp. 1-4.

U.S. Official Action—U.S. Appl. No. 12/517,981—Dec. 2, 2011.

* cited by examiner

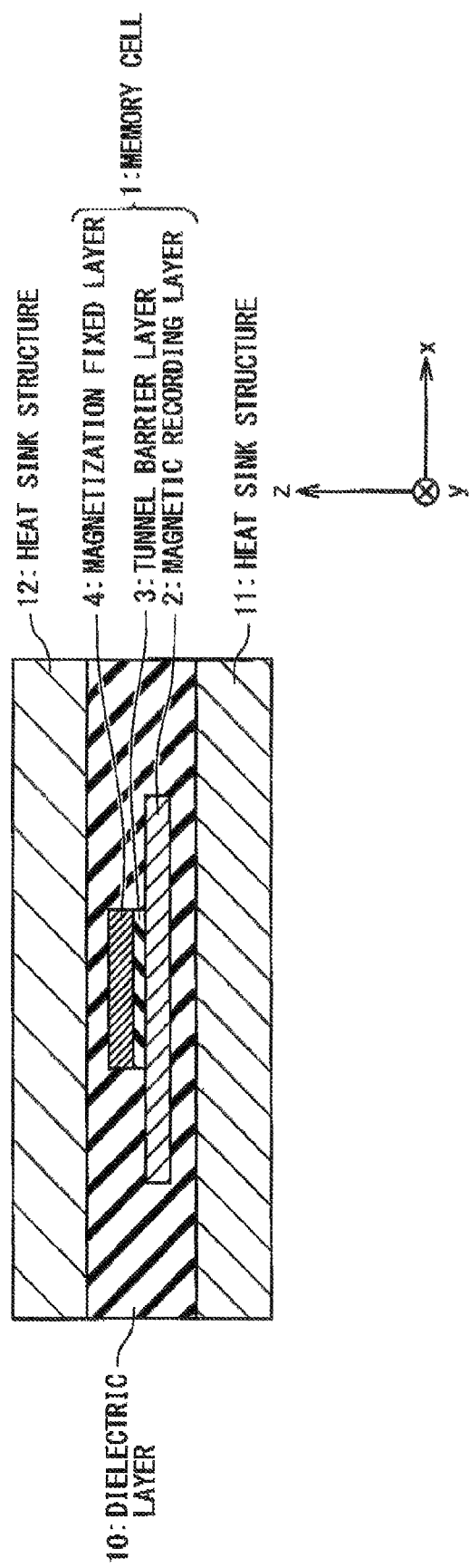

MAGNETIC RANDOM ACCESS MEMORY

CROSS REFERENCE TO RELATED APPLICATIONS

This application is a division of co-pending application Ser. No. 12/297,153 filed on Oct. 14, 2008, which is a National Stage of PCT/JP2007/057839 filed on Apr. 9, 2007, which claims foreign priority to Japanese Application No. 2006-108480 filed on Apr. 11, 2006. The entire content of each of these applications is hereby expressly incorporated by reference.

TECHNICAL FIELD

The present invention relates to an MRAM (magnetic random access memory), and more particularly relates to an MRAM in which a spin-polarized current is used to invert the magnetization to write data.

BACKGROUND ART

One of the promising methods for data writing in MRAMs proposed in recent years is the spin momentum transfer, which involves injecting a spin-polarized current as a write current into a magnetic recording layer and consequently inverting the magnetization of the magnetic recording layer. The spin momentum transfer allows decreasing the necessary current with the reduction of the size of the memory cell, while the magnetization inversion by using the current magnetic field is accompanied by an increase in the necessary current with the decrease in the size of a memory cell. Thus, the spin momentum transfer is considered as a promising method to realize an MRAM with an increased capacity.

However, the use of spin momentum transfer for a magnetic tunnel junction device requires overcoming the problem of the tunnel barrier layer breakdown. In the current technique, the spin-polarized current of several mA or more is required to be injected into the magnetic recording layer, when spin momentum transfer is used to invert the magnetization. However, feeding such a large current through the magnetic tunnel junction may result in the breakdown of the tunnel barrier layer.

One approach for overcoming the problem of the tunnel barrier layer breakdown is a technique that feeds a spin-polarized current in the in-plane direction of the magnetic recording layer to cause magnetization inversion. Such techniques are disclosed in, for example, Japanese Laid Open Patent Application (P2005-191032A), Japanese Laid Open Patent Application (P2005-123617A), and U.S. Pat. No. 6,781,871. Feeding a spin-polarized current in the in-plane direction of the magnetic recording layer allows moving the magnetic wall of the magnetic recording layer and/or exerting a torque on the magnetization of the magnetic recording layer by the spin-polarized current, consequently inverting the magnetization of the magnetic recording layer. The technique which feeds a spin-polarized current in the in-plane direction of the magnetic recording layer eliminates the need for flowing the spin-polarized current through the tunnel barrier layer, effectively avoiding the problem of the breakdown of the tunnel barrier layer.

According to a study of the inventor, one issue of the MRAM in which a spin-polarized current is flown in the in-plane direction of the magnetic recording layer is the heat generation in the magnetic recording layer. The resistance of the magnetic recording layer is inevitably high in the in-plane direction, since ferromagnetic material has a high electric resistivity in general. On the other hand, the inversion of the magnetization of the magnetic recording layer requires a high spin-polarized current to some extent. Therefore, feeding the spin-polarized current in the in-plane direction of the magnetic recording layer for data write increases the temperature of the memory cell. The temperature increase in the memory cell undesirably causes the drop in the reliability of the MRAM operation. It is desired to provide a technique for suppressing the temperature increase caused by the write current flowing in the in-plane direction of the magnetic recording layer.

DISCLOSURE OF INVENTION

It is therefore an object of the present invention to provide a technique for suppressing the temperature increase caused by the write current flowing in the in-plane direction of the magnetic recording layer.

In one aspect of the present invention, a magnetic random access memory is provided with a magnetic recording layer including a magnetization free region having a reversible magnetization, through which layer a write current is flown in an in-plane direction; a magnetization fixed layer having a fixed magnetization; a non-magnetic layer provided between the magnetization free region and the magnetization fixed layer; and a heat sink structure provided to be opposed to the magnetic recording layer and having a function of receiving and radiating heat generated in the magnetic recording layer. The magnetic random access memory thus-structured radiates heat generated in the magnetic recording layer by using the heat sink structure, suppressing the temperature increase caused by the write current flown in the in-plane direction.

In one embodiment, the magnetic recording layer further includes a first magnetization fixed region coupled with a first boundary of said magnetization free region and a second magnetization fixed region coupled with a second boundary of said magnetization free region. In this case, the write current is flown from said first magnetization fixed region to the second magnetization fixed region or from the second magnetization fixed region to the first magnetization fixed region.

To improve the heat radiation efficiency, it is preferable that the heat sink structure is directly coupled with said magnetic recording layer.

In one embodiment, the magnetic random access memory further includes a first interconnection electrically connected with the first magnetization fixed region; and a second interconnection electrically connected with the second magnetization fixed region. In this case, the heat sink structure is preferably provided between the first magnetization fixed region and the first interconnection.

In the case where the magnetic random access memory further includes a via contact providing a connection between the second magnetization fixed region and the second interconnection, it is preferable that the heat sink structure is provided with an opening, and the via contact is provided through said opening.

The magnetic random access memory is preferably provided with another heat sink structure provided between the second magnetization fixed region and the second interconnection so as to be opposed to the magnetic recording layer and having a function of receiving and radiating heat generated in said magnetic recording layer.

In this case, it is preferable that the heat sink structure is directly coupled with the first magnetization fixed region, and the other heat sink structure is directly coupled with the second magnetization fixed region.

When the magnetic random access memory further includes a third interconnection electrically connected to the magnetization fixed layer, the heat sink structure may be provided between the third interconnection and the magnetization fixed layer. In this case, it is preferable that the heat sink structure is directly coupled with the magnetization fixed layer. In this case, the heat sink structure is preferably provided within a via contact layer just below an interconnection layer within which the third interconnection is provided.

In another embodiment, it is preferable that the third interconnection functions as the heat sink structure by including an interconnection main body extending in a first direction in which a read current is flown and a protrusion protruding from the interconnection main body in a second direction vertical to the first direction.

In another embodiment, it is preferable that a first interconnection electrically connected with the first magnetization fixed region, through which interconnection the write current is flown, functions as the heat sink structure by including an interconnection main body extending in a first direction in which the write current is flown and a protrusion protruding from the interconnection main body in a second direction vertical to the first direction.

The heat sink structure may be positioned within the same interconnection layer as a first interconnection electrically connected with the first magnetization fixed region and a second interconnection electrically connected with the second magnetization fixed region.

The heat sink structure may be positioned within the same interconnection layer as a third interconnection electrically connected with the magnetization fixed layer.

In another aspect of the present invention, a magnetic random access memory is provided with a magnetic recording layer including a magnetization free region having a reversible magnetization, a first magnetization fixed region connected to a first boundary of the magnetization free region, and a second magnetization fixed region connected to a second boundary of the magnetization free region, through which layer a write current is flown in an in-plane direction; a magnetization fixed layer having a fixed magnetization; a non-magnetic layer provided between the magnetization free region and the magnetization fixed layer; and a first interconnection electrically connected to the first magnetization fixed region. The write current is flown from the first magnetization fixed region to the second magnetization fixed region or from the second magnetization fixed region to the first magnetization fixed region. The first interconnection includes: an interconnection main body extending in a first direction in which the write current is flown; and a protrusion protruding from the interconnection main body in a second direction vertical to the first direction, the protrusion being opposed to the magnetic recording layer.

In the magnetic random access memory thus-structured, the first interconnection, which includes the protrusion, functions as a heat sink structure that radiates heat generated in the magnetic recording layer, suppressing the temperature increase caused by the write current flown in the in-plane direction.

In still another aspect of the present invention, a magnetic random access memory is provided with: a magnetic recording layer including a magnetization free region having a reversible magnetization, through which layer a write current is flown in an in-plane direction; a magnetization fixed layer having a fixed magnetization; a non-magnetic layer provided between the magnetization free region and the magnetization fixed region; and a third interconnection electrically connected to the magnetization fixed layer. The third interconnection includes: an interconnection main body extending in a first direction in which a read current is flown; and a protrusion protruding from the interconnection main body in a second direction vertical to the first direction, the protrusion being opposed to the magnetic recording layer.

In the magnetic random access memory thus-structured, the third interconnection, which includes the protrusion, functions as a heat sink structure that radiates heat generated in the magnetic recording layer, suppressing the temperature increase caused by the write current flown in the in-plane direction.

BRIEF DESCRIPTION OF DRAWINGS

FIG. 1A is a sectional view showing the structure of an MRAM in one exemplary embodiment of the present invention;

BEST MODES FOR CARRYING OUT THE INVENTION

Figure 1B:
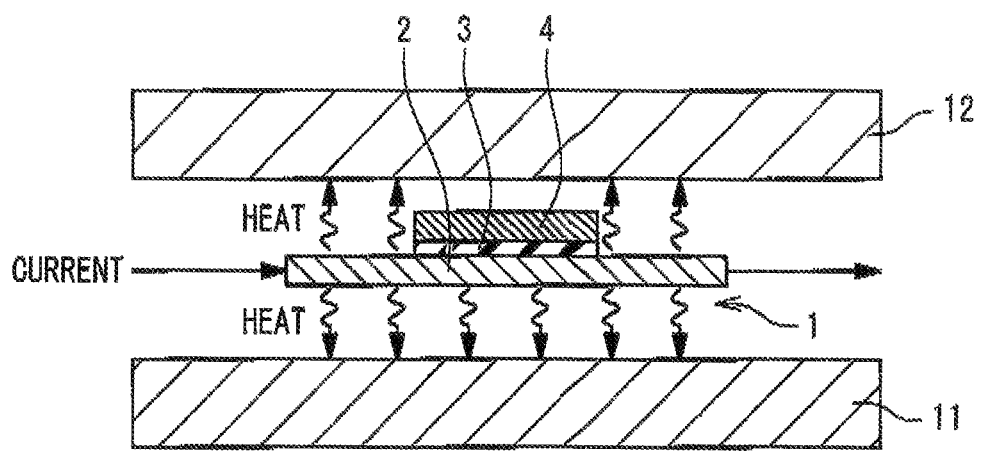
FIG. 1B is a conceptual view explaining the function of the MRAM in FIG. 1A.

In the following, various exemplary embodiments of the present invention will be described below with reference to the attached drawings. It should be noted that same or corresponding numerals denote same or similar elements in the drawings.

FIG. 1A is a sectional view showing the schematic structure of an MRAM in one exemplary embodiment of the present invention. In an MRAM in one exemplary embodiment of the present invention, a memory cell 1 is formed within a dielectric layer 10. The memory cell 1 is provided with a magnetic recording layer 2, a tunnel barrier layer 3 and a magnetization fixed layer 4.

Figure 2:
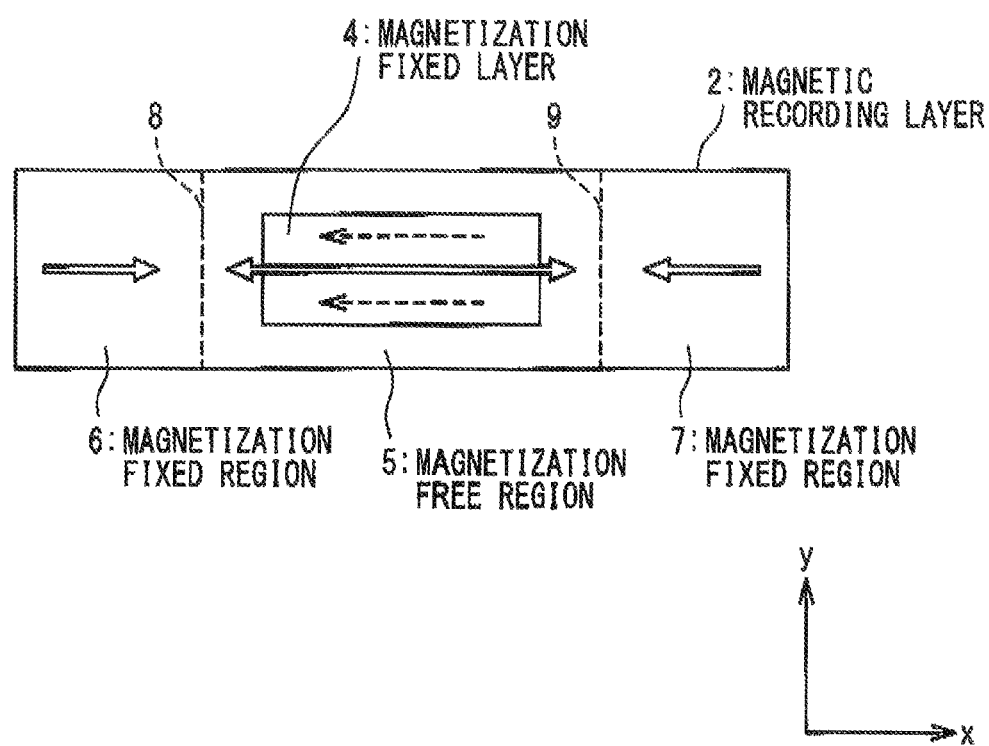
FIG. 2 is a plan view showing the structure of an MRAM in one exemplary embodiment of the present invention.

The magnetic recording layer 2 is provided with a magnetization free region 5 and magnetization fixed regions 6 and 7, as shown in FIG. 2. The magnetization free region 5 is a region in which one-bit data is stored as the direction of the magnetization thereof. The magnetization free region 5 is shaped to be long in the x-axis direction, and the magnetization of the magnetization free region 5 is oriented in parallel to the x-axis direction. The magnetization free region 5 is formed of magnetically soft ferromagnetic material, and the magnetization of the magnetization free region 5 is reversible. In this exemplary embodiment, the state in which the direction of the magnetization of the magnetization free region 5 is the +x direction is associated with data "1", and the state in which the direction of the magnetization of the magnetization free region 5 is the −x direction is associated with data 0".

The magnetization fixed regions 6 and 7 are regions used to inject a spin-polarized current into the magnetization free region 5 in the in-plane direction, both formed of ferromagnetic material. The magnetization fixed region 6 is coupled with the magnetization free region 5 on the boundary 8 at one end of the magnetization free region 5, and the magnetization fixed region 7 is coupled with the magnetization free region 5 in the boundary 9 at the other end of the magnetization free region 5. The magnetization fixed regions 6 and 7 are adjacent to the magnetization free region 5 in the x-axis direction and shaped to be long in the x-axis direction. The magnetization directions of the magnetization fixed regions 6 and 7 are both fixed in the directions toward the magnetization free region 5. Specifically, the magnetization of the magnetization fixed region 6 is fixed in the +x direction, and the magnetization of the magnetization fixed region 7 is fixed in the −x direction. Instead, the magnetization directions of the magnetization fixed regions 6 and 7 may be both fixed in the directions away from the magnetization free region 5. In this case, the magnetization of the magnetization fixed region 6 is fixed in the −x direction, and the magnetization of the magnetization fixed region 7 is fixed in the +x direction.

Referring back to FIG. 1A, the tunnel barrier layer 3 is a thin non-magnetic dielectric layer through which a tunnel current flows between the magnetization fixed layer 4 and the magnetization free region 5. The tunnel barrier layer 3 is formed of, for example, aluminum oxide ($AlO_x$) or magnesium oxide (MgO).

The magnetization fixed layer 4 is a ferromagnetic layer having a fixed magnetization. The magnetization fixed layer 4 is formed of magnetically hard ferromagnetic material, such as CoFe. As shown in FIG. 2, the magnetization fixed layer 4 is shaped to be long in the x-axis direction, and the magnetization of the magnetization fixed layer 4 is oriented in the −x direction. The magnetization free region 5 of the magnetic recording layer 2, the tunnel barrier layer 3 and the magnetization fixed layer 4 configure a magnetic tunnel junction (MTJ) which exhibits the TMR effect, and the resistance of the magnetic tunnel junction depends on the relative direction between the magnetizations of the magnetization fixed layer 4 and the magnetization free region 5.

The TMR effect is used to read data stored in the magnetization free region 5. The resistance of the magnetic tunnel junction, which includes the tunnel barrier layer 3 and the magnetization fixed layer 4, depends on the relative direction between the magnetizations of the magnetization fixed layer 4 and the magnetization free region 5, due to the TMR effect. When the magnetizations of the magnetization fixed layer 4 and the magnetization free region 5 are anti-parallel, the magnetic tunnel junction exhibits a relatively high resistance, and when the magnetizations of the magnetization fixed layer 4 and the magnetization free region 5 are parallel, the magnetic tunnel junction exhibits a relatively low resistance. The data stored in the magnetic recording layer 2 is identified by detecting the change in the resistance of the magnetic tunnel junction. The change in the resistance of the magnetic tunnel junction can be identified by applying a predetermined voltage to the magnetic tunnel junction and measuring the current flowing through the magnetic tunnel junction, or by feeding a predetermined current to the magnetic tunnel junction and measuring the voltage generated across the magnetic tunnel junction.

The data writing into the magnetization free region 5 is carried out by injecting a spin-polarized current into the magnetization free region 5 from the magnetization fixed region 6 or 7. To write data "1", a current is flown in the +x direction through the magnetic recording layer 2. This allows injecting a spin-polarized current into the magnetization free region 5 from the magnetization fixed region 6 (which has a magnetization fixed in the +x direction). The injected spin-polarized current pushes the magnetic wall of the magnetization free region 5 in the +x direction, or applies a torque to the magnetization, and thereby orients the magnetization of the magnetization free region 5 in the +x direction. This achieves writing data "1" onto the magnetic recording layer. To write data "0", on the other hand, a spin-polarized current is injected into the magnetization free region 5 from the magnetization fixed region 7 (which has a magnetization fixed in the −x direction). This allows orienting the magnetization of the magnetization free region 5 in the −x direction.

The MRAM in one exemplary embodiment of the present invention additionally includes heat sink structures 11 and 12. The heat sink structure 11 is formed to be opposed to the bottom surface of the magnetic recording layer 2, and the heat sink structure 12 is formed to be opposed to the top surface of the magnetic recording layer 2. The heat sink structures 11 and 12 are formed of material with a high thermal conductivity, more specifically, metal such as copper, aluminum and tungsten, and the heat sink structures 11 and 12 are dedicated to receive and radiate the heat generated in the magnetic recording layer 2. As shown in FIG. 1B, the magnetic recording layer 2, which is formed of ferromagnetic material, suffers from a problem of the heat generation in the magnetic recording layer 2 due to the inevitably high resistance thereof, when a spin-polarized current is fed in write operations. As shown in FIG. 1B, the heat sink structures 11 and 12 function as heat sinks for radiating the heat generated in the magnetic recording layer 2 and effectively suppresses the temperature increase in the magnetic recording layer 2. Although the MRAM in FIG. 1A is provided with the heat sink structures 11 and 12, opposed to the top and bottom surfaces of the magnetic recording layer 2, respectively, only one of the heat sink structures 11 and 12 may be provided.

Figure 3:
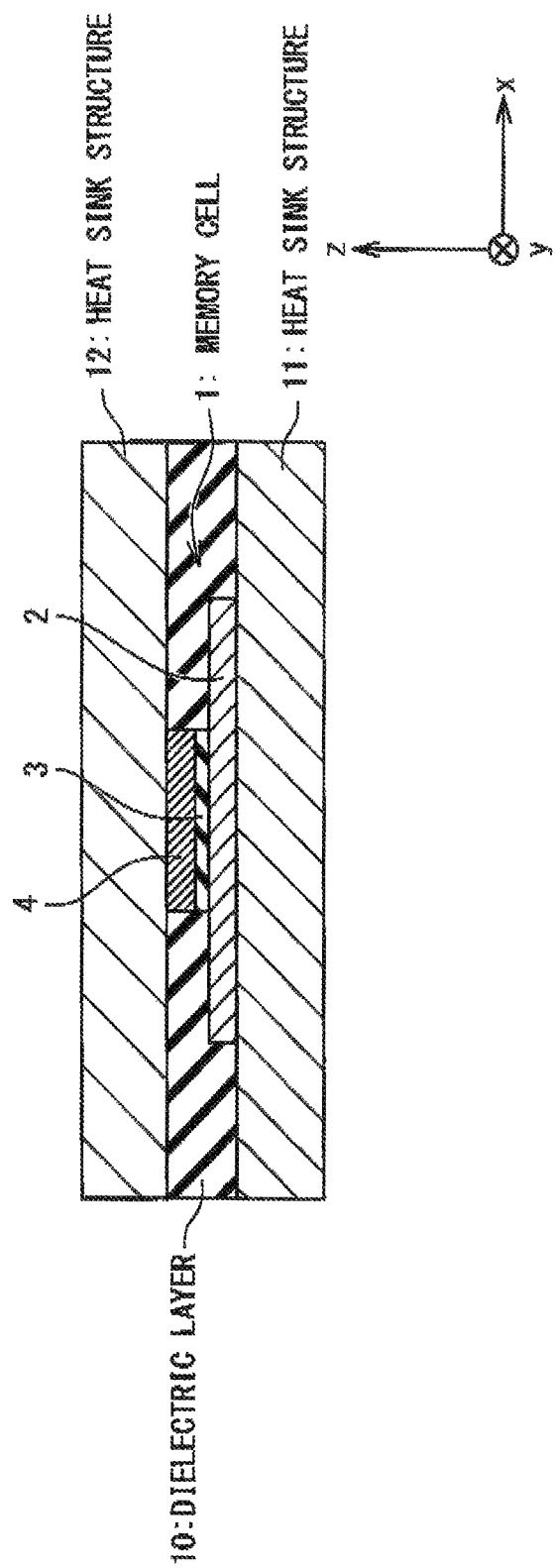
FIG. 3 is a sectional view showing the structure of an MRAM in another exemplary embodiment of the present invention.

As shown in FIG. 3, the heat sink structure 11 may be directly coupled with the bottom surface of the magnetic recording layer 2. The direct contact of the heat sink structure 11 with the magnetic recording layer 2 preferably improves the heat radiation efficiency. In the same way, the heat sink structure 12 may be directly coupled with the magnetization fixed layer 4.

Figure 4:
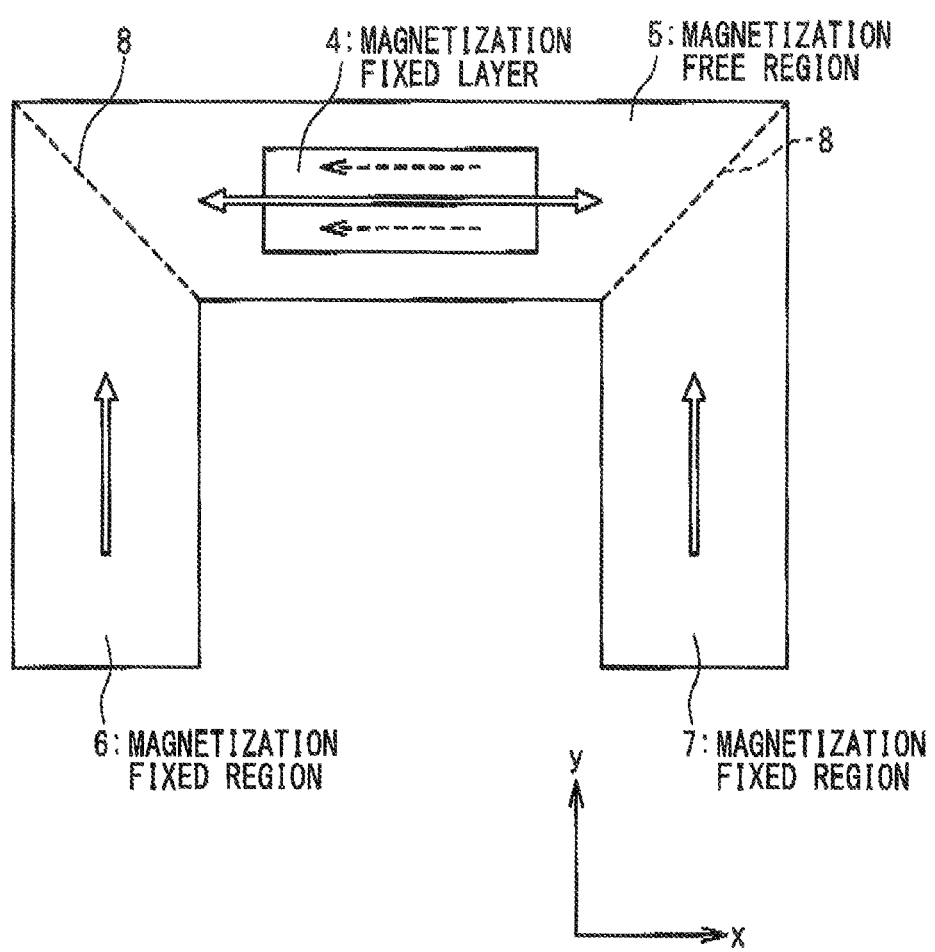
FIG. 4 is a sectional view showing the structure of an MRAM in still another exemplary embodiment of the present invention.

The geometrical arrangement of the magnetization free region 5 and the magnetization fixed regions 6 and 7 in the magnetic recording layer 2 is not limited to the arrangement in which the magnetization free region 5 and the magnetization fixed regions 6 and 7 are aligned in a straight line. For example, as shown in FIG. 4, the magnetization free region 5 may be formed to be long in the x-axis direction, and the magnetization fixed regions 6 and 7 may be formed long in the y-axis direction. In this case, the magnetizations of the magnetization fixed regions 6 and 7 are both fixed in the +y direction. Instead, the magnetizations of the magnetization fixed regions 6 and 7 may be both fixed in the −y direction.

In the following, a description is given of specific examples of the present invention.

FIRST EXAMPLE

Figure 5A:
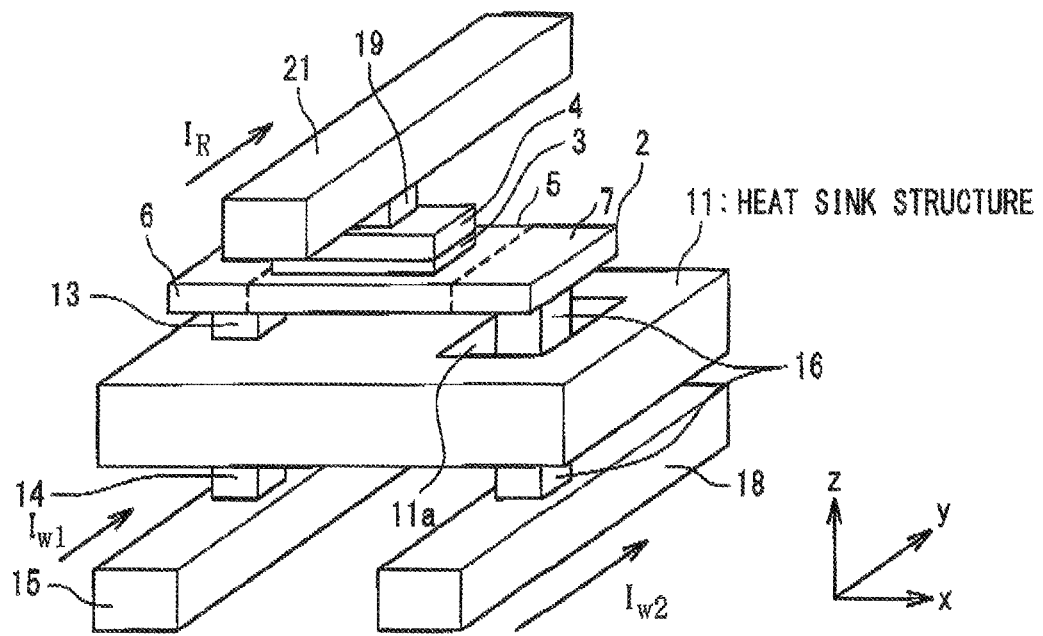
FIG. 5A is a perspective view showing the structure of an MRAM in a first example.

FIG. 5A is a perspective view showing the structure of an MRAM in a first example. Similarly to the MRAM in FIG. 1A, a memory cell 1 is provided with a magnetic recording layer 2, a tunnel barrier layer 3 and a magnetization fixed layer 4. The magnetization fixed layer 4 is connected to an upper interconnection 21 for feeding a read current $I_R$ through a via contact 19. The upper interconnection 21 is disposed to extend in the y-axis direction. This implies that the read current $I_R$ flows in the y-axis direction.

In the first example, the heat sink structure 11 is formed in the memory cell 1 between the magnetic recording layer 2 and lower interconnections 15 and 18 through which write currents $IW_1$ and $IW_2$ are flown. The lower interconnections 15 and 18 are both disposed to extend in the y-axis direction. The heat sink structure 11 is connected to the lower interconnection 15 through a via contact 14 and also connected to the magnetization fixed region 6 of the magnetic recording layer 2 through a via contact 13. The lower interconnection 18 is connected through a via contact 16 to the magnetization fixed region 7 of the magnetic recording layer 2. The via contact 16 is formed through an opening 11a provided through the heat sink structure 11, and electrically isolated from the heat sink structure 11.

In the MRAM such structured, a voltage is applied between the upper interconnection 21 and the lower interconnection 15 (or between the upper interconnection 21 and the lower interconnection 18) in a read operation to flow a read current $I_R$ from the upper interconnection 21 to the lower interconnection 15 through the memory cell 1. The data stored in the magnetization free region 5 of the magnetic recording layer 2 is identified from the current level of the read current $I_R$. In a write operation, on the other hand, a write current $IW_1$ is fed from the lower interconnection 15 to the lower interconnection 18, or a write current $IW_2$ is fed from the lower interconnection 18 to the lower interconnection 15, depending on data to be written. When the write current $IW_1$ is fed from the lower interconnection 15 to the lower interconnection 18, the spin-polarized current is injected into the magnetization free region 5 from the magnetization fixed region 6, and the magnetization of the magnetization free region 5 is oriented in the +x direction. That is, data "1" are written onto the magnetic recording layer. On the other hand, when the write current $IW_2$ is flown from the lower interconnection 18 to the lower interconnection 15, the spin-polarized current is injected into the magnetization free region 5 from the magnetization fixed region 7 and the magnetization of the magnetization free region 5 is oriented in the −x direction. That is, data "0" are written onto the magnetic recording layer.

Figure 5B:
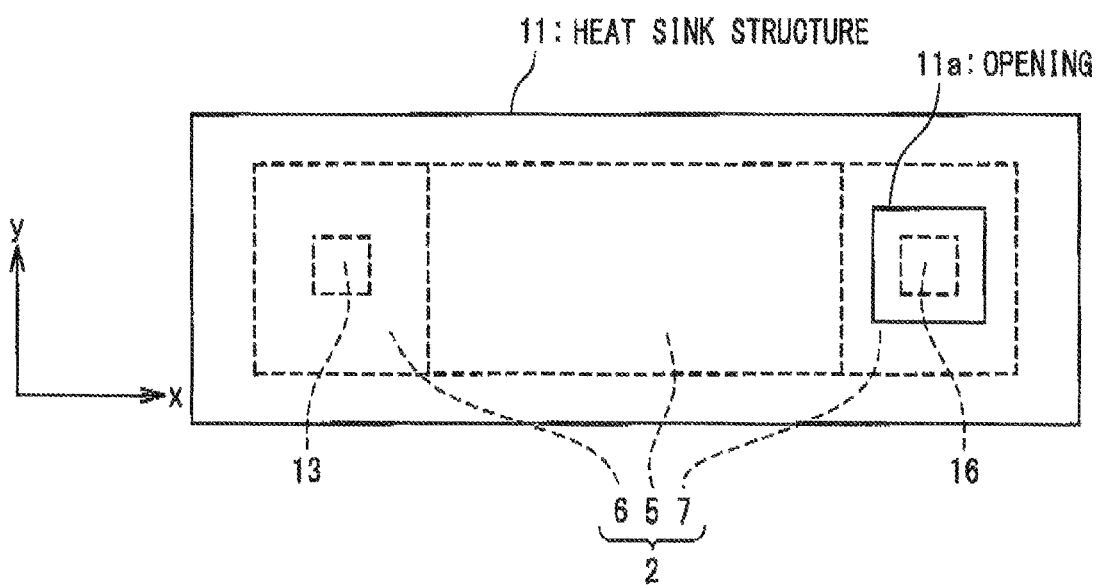
FIG. 5B is a plan view showing the structure of the MRAM in the first example.

It is preferable that the heat sink structure 11 is arranged in a shape and arrangement which maximize the area opposed to the magnetic recording layer 2. FIG. 5B is a plan view showing a preferred shape and arrangement of the heat sink structure 11. Preferably, the heat sink structure 11 is formed to be opposed at least to the whole of the magnetization free region 5 and magnetization fixed region 6 of the magnetic recording layer 2. Such arrangement increases the area opposed to the magnetic recording layer 2, and effectively improves the heat dissipation efficiency of the heat sink structure 11. In order to further increase the area at which the heat sink structure 11 is opposed to the magnetic recording layer 2, the heat sink structure 11 is preferably formed to be opposed to the whole of the magnetic recording layer 2, except the portion opposed to the opening 11a formed through the heat sink structure 11. FIG. 5B shows an arrangement of the heat sink structure 11 in which the heat sink structure 11 is formed to be opposed to the whole of the magnetic recording layer 2, except the portion opposed to the opening 11a formed through the heat sink structure 11.

SECOND EXAMPLE

Figure 6A:
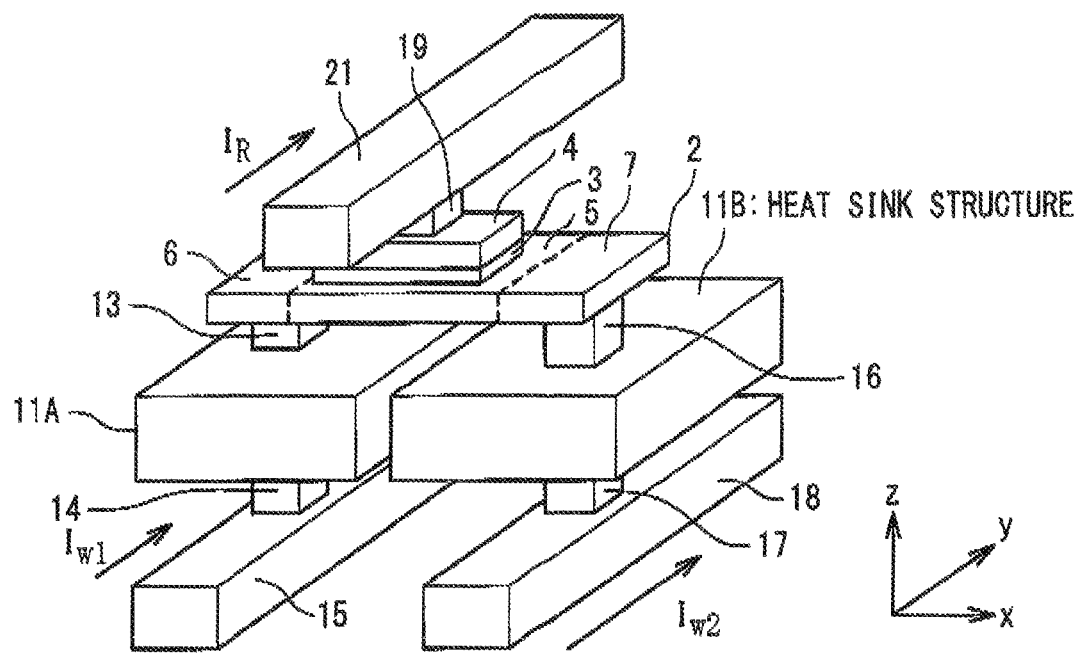
FIG. 6A is a perspective view showing the structure of an MRAM in a second example.

FIG. 6A is a perspective view showing the structure of an MRAM in a second example. In the second example, two heat sink structures 11A and 11B are formed between the magnetic recording layer 2 and the lower interconnections 15 and 18. The heat sink structure 11A is connected to the magnetization fixed region 6 of the magnetic recording layer 2 through a via contact 13 and also connected through a via contact 14 to the lower interconnection 15. On the other hand, the heat sink structure 11B is connected through a via contact 16 to the magnetization fixed region 7 of the magnetic recording layer 2 and also connected through the via contact 17 to the lower interconnection 18. Read and write operations in the such-structured MRAM of the second example are performed similarly to those in the MRAM of the first example.

Figure 6B:
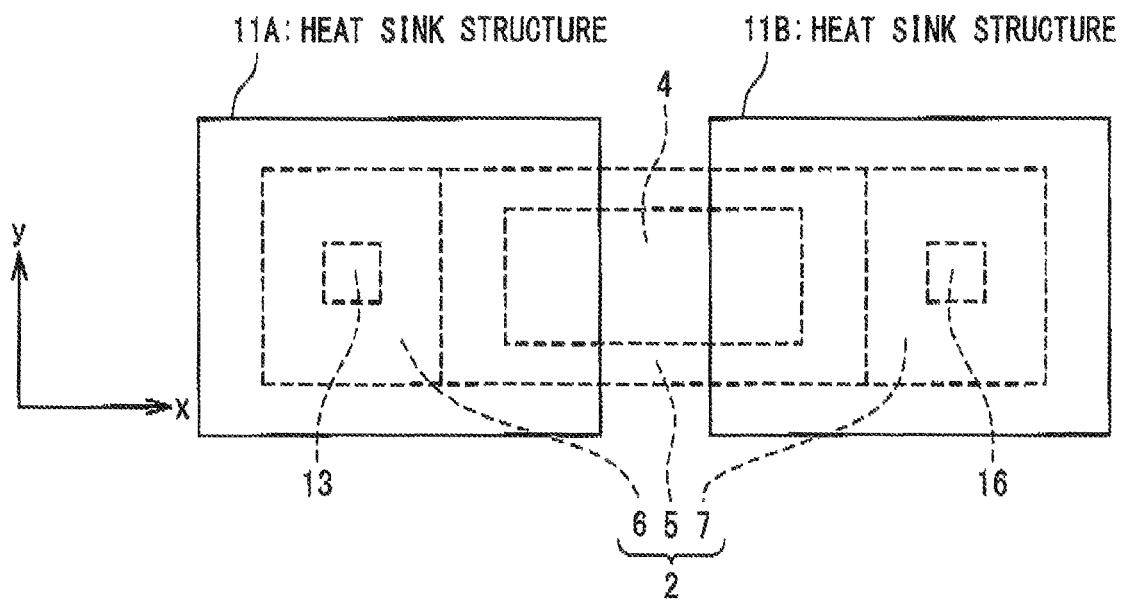
FIG. 6B is a plan view showing the structure of the MRAM in the second example.

Preferably, the heat sink structures 11A and 11B are arranged in a shape and arrangement which maximize the area opposed to the magnetic recording layer 2. FIG. 6B is a plan view showing a preferable structure and arrangement for the heat sink structures 11A and 11B. Preferably, the heat sink structure 11A is formed to be opposed at least to the whole of the magnetization free region 6 of the magnetic recording layer 2. Preferably, the heat sink structure 11B is formed to be opposed to the whole of the magnetization fixed region 7 of the magnetic recording layer 2. Such arrangement increases the area at which the heat sink structures 11A and 11B are opposed to the magnetic recording layer 2 and effectively improves the heat radiation efficiency.

It is further preferable for further increasing the area opposed to the magnetic recording layer 2 that the heat sink structures 11A and 11B are formed to be opposed to at least a portion of the magnetization free region 5 of the magnetic recording layer 2; it is further preferable that the heat sink structures 11A and 11B are arranged to be opposed to at least a portion of the bottom surface of the magnetization fixed layer 4 (that is, the face coupled with the tunnel barrier layer 3). FIG. 6B shows an arrangement in which the heat sink structures 11A and 11B are each opposed to portions of the bottom surface of the magnetization fixed layer 4. It is preferable that the heat sink structures 11A and 11B are spaced by a narrow spacing; it is most preferable that the heat sink structures 11A and 11B are spaced by the same interval as the minimal pitch of the design rule of the MRAM.

THIRD EXAMPLE

Figure 7A:
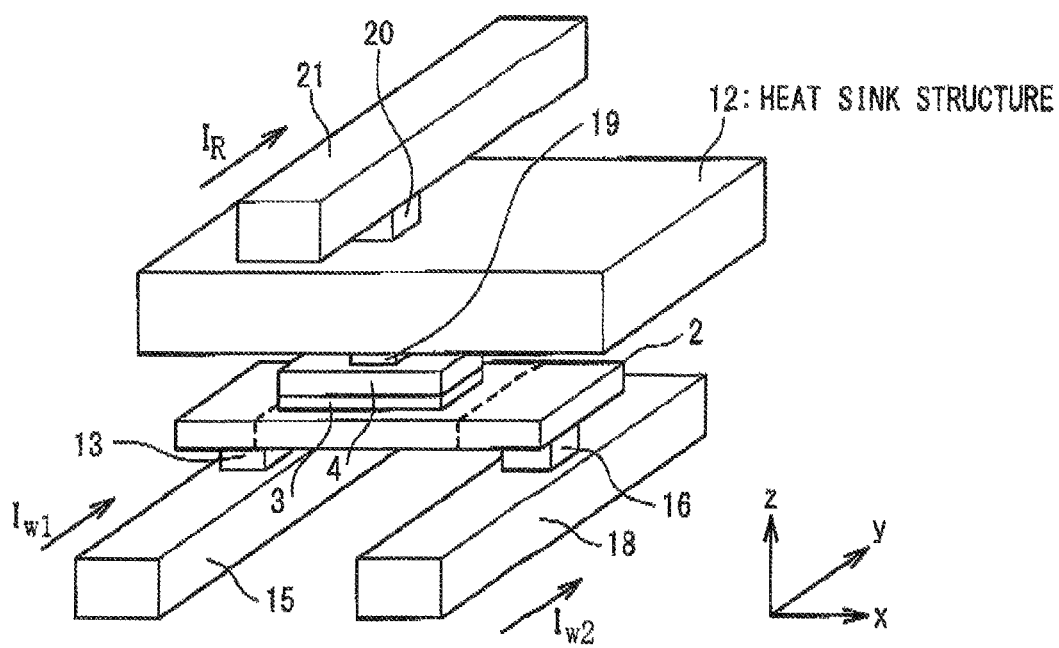
FIG. 7A is a perspective view showing the structure of an MRAM in a third example.

FIG. 7A is a perspective view showing the structure of an MRAM in a third example. In the third example, a heat sink structure 12 is formed between the magnetization fixed layer 4 and the upper interconnection 21 in the memory cell 1. The heat sink structure 12 is connected to the magnetization fixed layer 4 through a via contact 19 and also connected to the upper interconnection 21 through a via contact 20. In the such-structured MRAM in the third example, read and write operations are executed similarly to those in the MRAM of the first example.

Figure 7B:
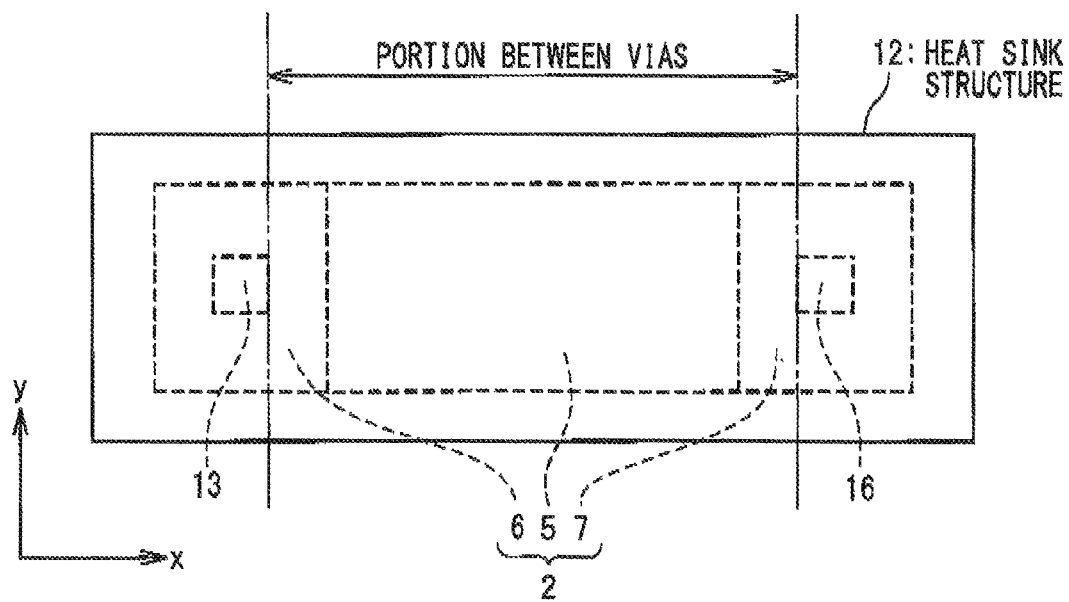
FIG. 7B is a plan view showing the structure of the MRAM in the third example.

Preferably, the heat sink structure 12 is arranged in a shape and arrangement which maximize the area opposed to the magnetic recording layer 2. FIG. 7B is a plan view showing a preferable structure and arrangement for the heat sink structure 12. Preferably, the heat sink structure 12 is formed to be opposed at least to the whole of the portion of the magnetic recording layer 2 between the via contacts 13 and 16. Such arrangement allows the heat radiation from the whole of the heat generating portion of the magnetic recording layer 2 (namely, the portion through which the spin-polarized current flows). For further improving the heat dissipation efficiency, it is further preferable that the heat sink structure 12 is formed to be opposed to the whole of the magnetic recording layer 2. Such arrangement increases the area opposed to the magnetic recording layer 2 and effectively improves the heat dissipation efficiency of the heat sink structure 12.

FOURTH EXAMPLE

Figure 8A:
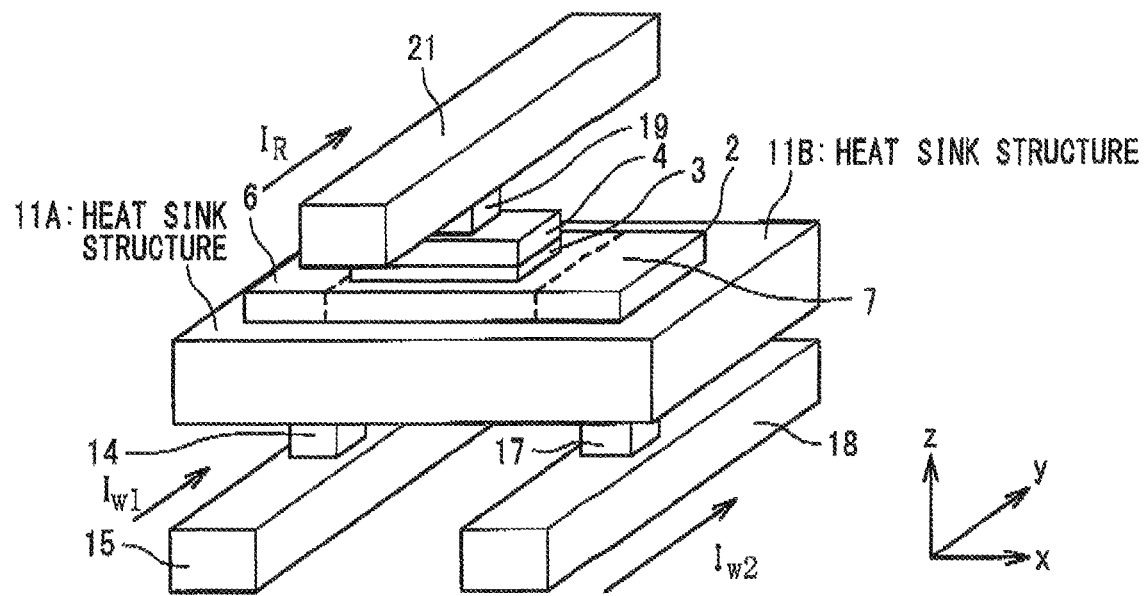
FIG. 8A is a perspective view showing the structure of an MRAM in a fourth example.

FIG. 8A is a perspective view showing the structure of an MRAM in a fourth example. In the MRAM of the fourth example, the heat sink structure 11 is directly coupled with the whole of the bottom surface of the magnetic recording layer 2. The heat sink structure 11 is connected to the lower interconnection 15 through the via contact 14 and further connected to the lower interconnection 18 through a via contact 17. The heat sink structure 11 is formed of material having a resistivity higher than that of the magnetic recording layer 2. This is important for feeding a larger current to the magnetic recording layer 2. Although the write current is branched into the heat sink structure 11 in the MRAM shown in FIG. 8A, a reduced current is flown through the heat sink structure 11, since the heat sink structure 11 is formed of material having a resistivity higher than that of the magnetic recording layer 2. On the other hand, the fact that the heat sink structure 11 is directly coupled with the entire surface of the bottom surface of the magnetic recording layer 2 enhances the heat transmission from the magnetic recording layer 2 to the heat sink structure 11, and thereby improves the heat radiation efficiency. In the such-structured MRAM of the fourth example, read and write operations are carried out similarly to those in the MRAM in the first example.

Figure 8B:
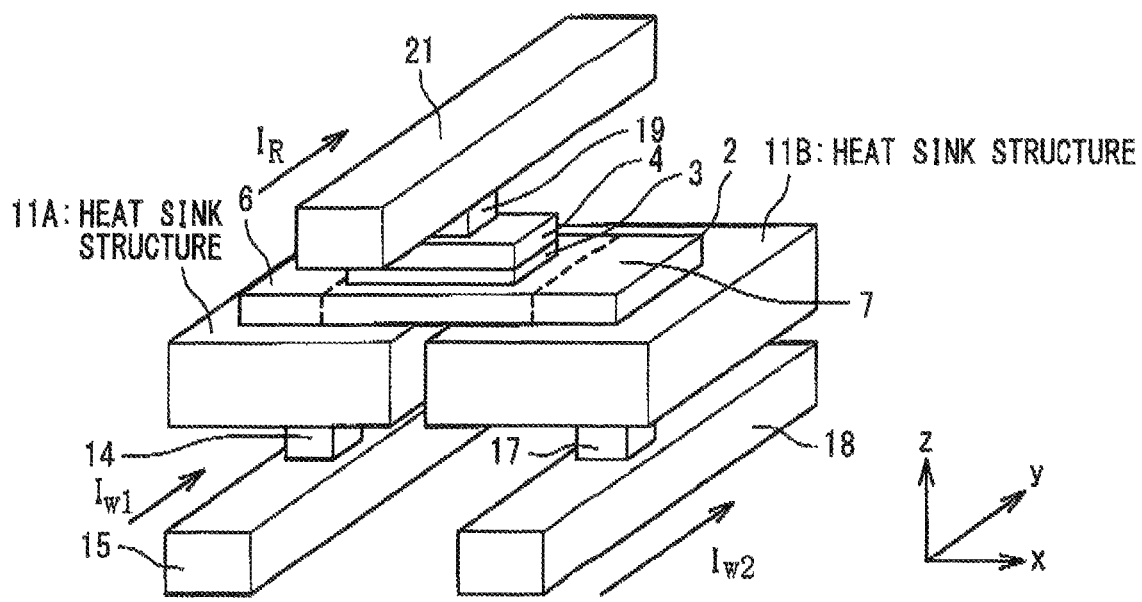
FIG. 8B is a perspective view showing another structure of the MRAM in the fourth example.

FIG. 8B is a perspective view showing another structure of the MRAM in the fourth example. In the MRAM of the fourth example, two heat sink structures 11A and 11B are directly coupled with the bottom surface of the magnetic recording layer 2. The heat sink structure 11A is directly coupled with the magnetization fixed region 6 of the magnetic recording layer 2 and also connected through the via contact 14 to the lower interconnection 15. On the other hand, the heat sink structure 11B is directly coupled with the magnetization fixed region 7 of the magnetic recording layer 2 and also connected to the lower interconnection 18 through the via contact 17. The fact that the two heat sink structures 11A and 11B are directly coupled with the bottom surface of the magnetic recording layer 2 enhances the heat transmission from the magnetic recording layer 2 to the heat sink structures 11A and 11B, and effectively improves the heat radiation efficiency. On the other hand, the current through the heat sink structure 11 (not through the magnetic recording layer 2) is reduced, since the heat sink structures 11A and 11B are electrically isolated. In the such-structured MRAM of the fourth example, read and write operations are carried out similarly to those in the MRAM in the first example.

Preferably, the width of the heat sink structure 11A in the x-axis direction (namely, the width in the direction vertical to the direction in which the lower interconnection 15 extends) is larger than that of the lower interconnection 15 through which the write current $IW_1$ flows. Such structure enhances the heat transmission from the magnetic recording layer 2 to the heat sink structures 11A and 11B, effectively improving the heat radiation efficiency. In the same way, it is preferable that the width of the heat sink structure 11B in the x-axis direction (namely, the width in the direction vertical to the direction in which the lower interconnection 18 extends) is larger than that of the lower interconnection 18 through which the write current $IW_2$ flows.

FIFTH EXAMPLE

Figure 9A:
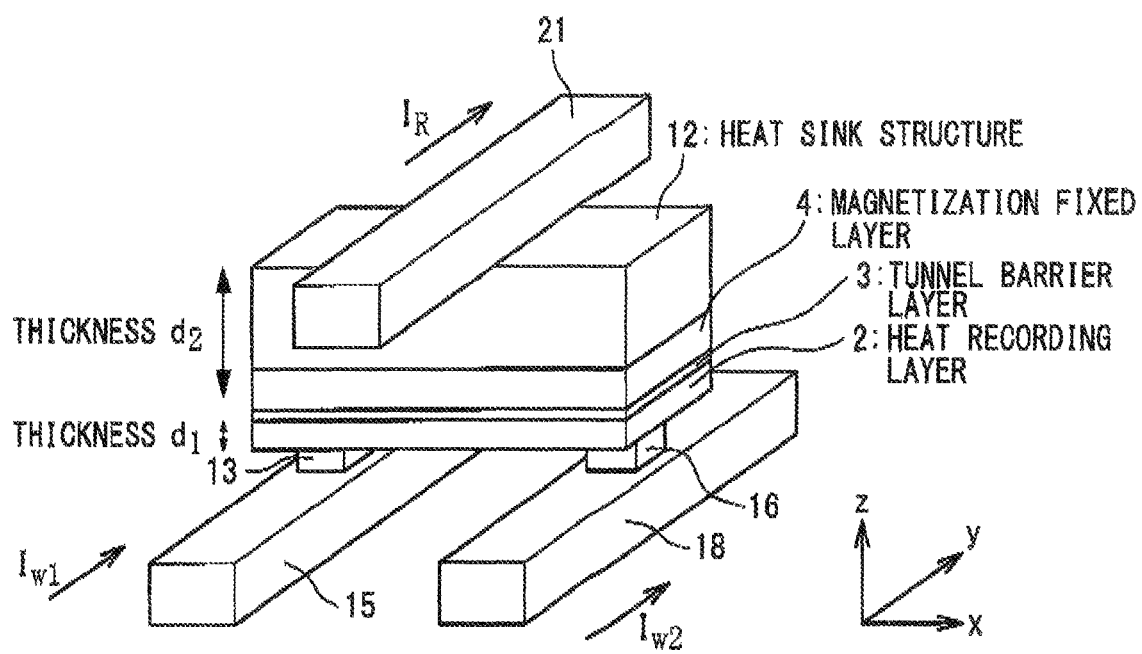
FIG. 9A is a perspective view showing the structure of an MRAM in a fifth example.

FIG. 9A is a perspective view showing the structure of an MRAM in a fifth example. In the MRAM of the fifth example, the heat sink structure 12 is directly coupled with the magnetization fixed layer 4. The heat sink structure 12 is formed within a via-contact layer located just below the interconnection layer within which the upper interconnection 21 is laid. The heat sink structure 12 is directly coupled with the upper interconnection 21. The heat sink structure 12 is mainly formed of copper (Cu) or tungsten (W). The structure in which the heat sink structure 12 is formed within the via contact layer located just under the interconnection layer within which the upper interconnection 21 is provided is preferable, because the step of producing the heat sink structure 12 is not additionally required. In the such-structured MRAM of the fifth example, read and write operations are carried out similarly to those in the MRAM in the first example.

Preferably, the width of the heat sink structure 12 in the x-axis direction (namely, the width in the direction vertical to the direction in which the lower interconnection 15 extends) is larger than that of the lower interconnection 15 through which the read current $I_R$ flows. Such structure enhances the heat transmission from the magnetic recording layer 2 to the heat sink structure 12, effectively improving the heat radiation efficiency.

It is also preferable that the thickness $d_2$ of the heat sink structure 12 is thicker than the thickness $d_1$ of the magnetic recording layer 2. Such structure effectively improves the heat radiation efficiency.

Figure 9B:
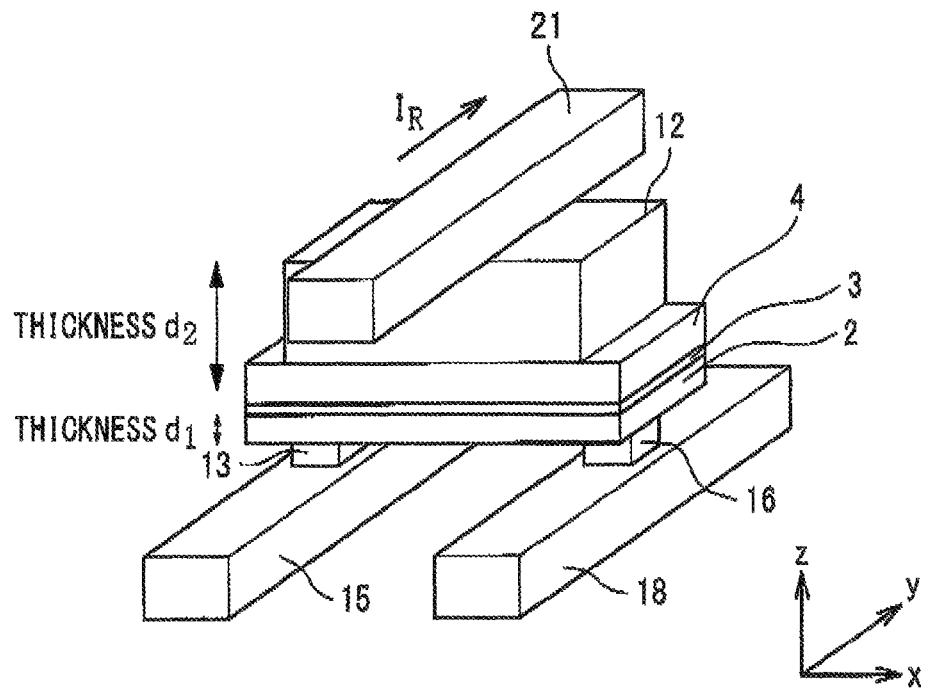
FIG. 9B is a perspective view showing another structure of the MRAM in the fifth example.
Figure 9C:
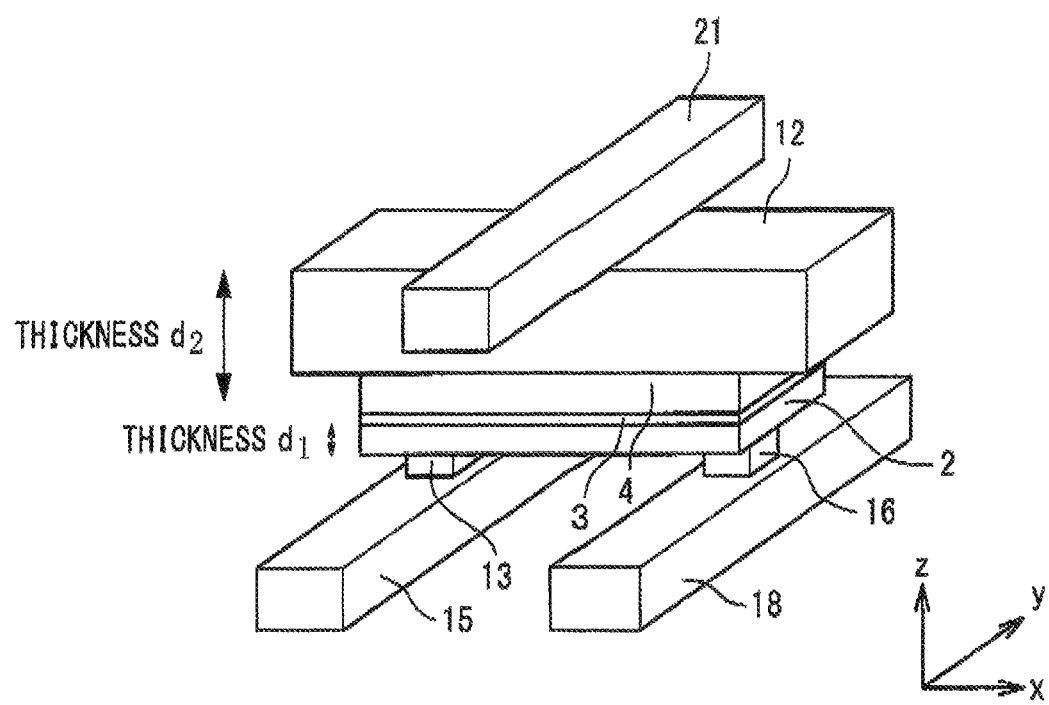
FIG. 9C is a perspective view showing still another structure of the MRAM in the fifth example.

As shown in FIGS. 9B and 9C, the heat sink structure 12 is not required to be perfectly aligned to the magnetization fixed layer 4. As shown in FIG. 9B, the heat sink structure 12 may be formed to be coupled with only a portion of the magnetization fixed layer 4. Also, as shown in FIG. 9C, the heat sink structure 12 may be coupled with the whole of the top surface of the magnetization fixed layer 4 and arranged to protrude from the magnetization fixed layer 4.

SIXTH EXAMPLE

Figure 10A:
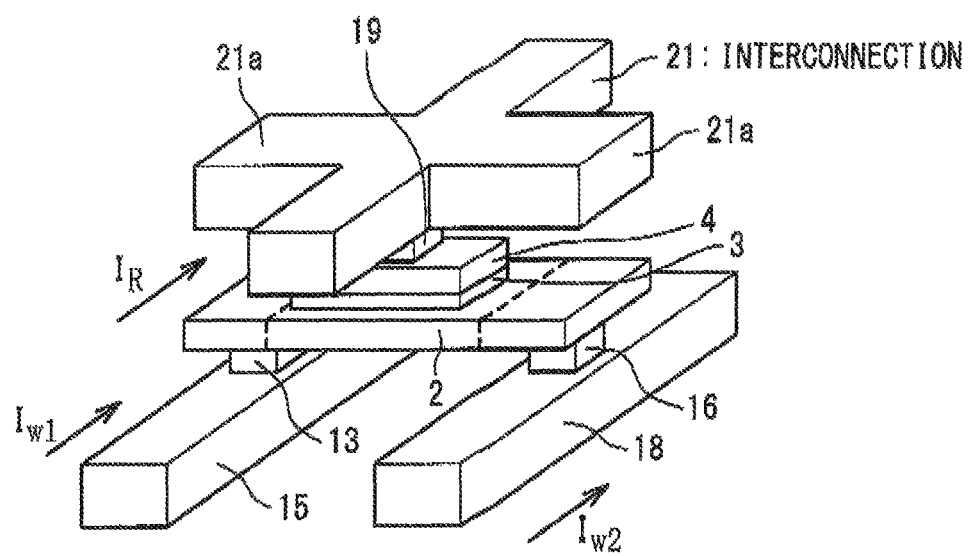
FIG. 10A is a perspective view showing the structure of an MRAM in a sixth example.

FIG. 10A is a perspective view showing the structure of an MRAM in a sixth example. In the MRAM of the sixth example, the upper interconnection 21 is shaped to function as a heat sink structure. That is, the upper interconnection 21 is provided with protrusions 21a which protrude in the directions (the x-axis directions for the sixth example) vertical to the extension direction (the y-axis direction in the sixth for the sixth example). The protrusions 21a are shaped to be opposed to the top surface of the magnetic recording layer 2. The such-shaped upper interconnection 21 effectively functions as a heat sink structure and effectively radiates the heat generated in the magnetic recording layer 2. The structure in which the upper interconnection 21 functions as the heat sink structure does not require an interconnection layer dedicated for forming the heat sink structure, allowing the MRAM to be manufactured with a reduced number of interconnection layers. In the such-structured MRAM of the sixth example, read and write operations are carried out similarly to those in the MRAM of the first example.

Figure 10B:
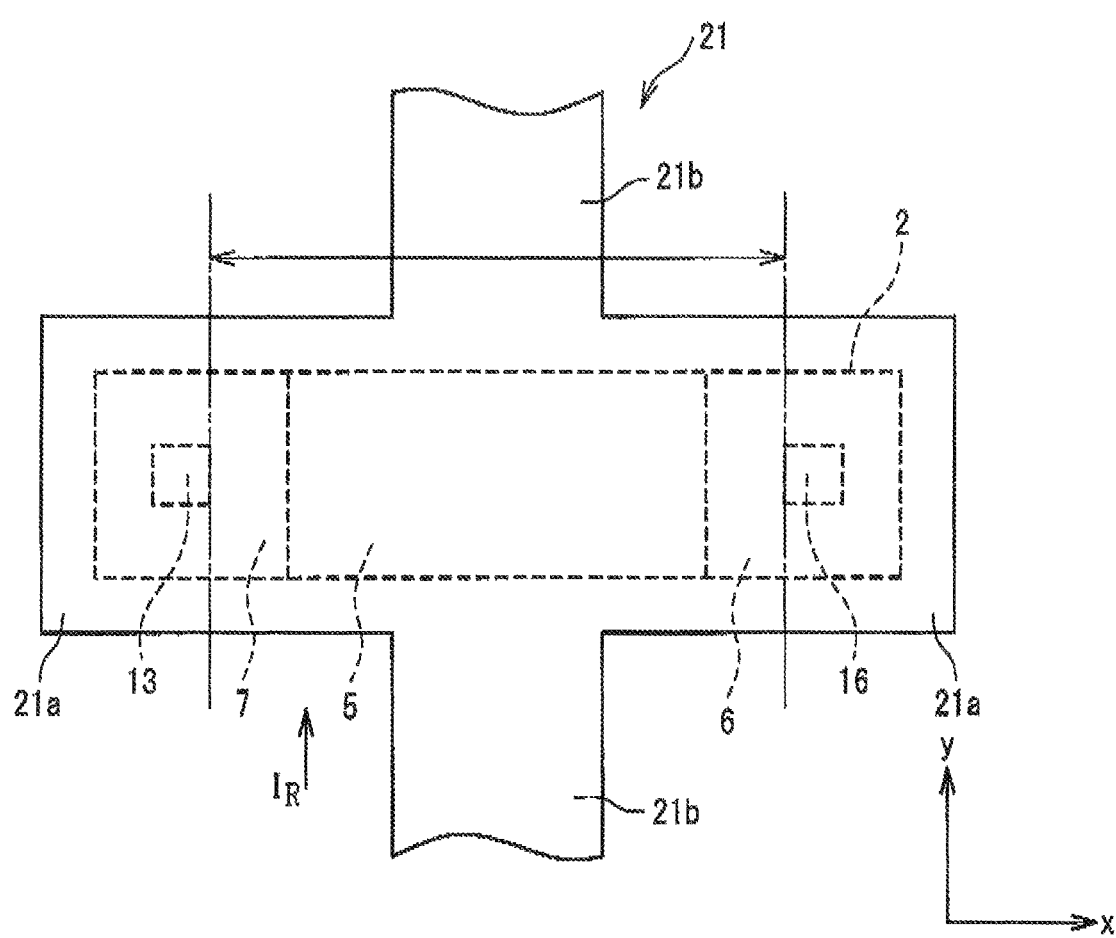
FIG. 10B is a plan view showing the structure of the MRAM in the sixth example.

Preferably, the upper interconnection 21 is arranged in a shape and arrangement which maximize the area opposed to the magnetic recording layer 2. FIG. 10B is a plan view showing a preferred shape of the upper interconnection 21. An interconnection main body 21b of the upper interconnection 21 is formed to extend in the y-axis direction (the direction in which the read current $I_R$ flows), and the protrusions 21a are formed to protrude in the x-axis directions from the wiring main body 21b. Preferably, the protrusions 21a are formed such that the upper interconnection 21 is shaped to be opposed at least to the whole of the portion between the via contacts 13 and 16 of the magnetic recording layer 2. Such arrangement enables the heat radiation from the whole of the heat generating portion of the magnetic recording layer 2 (namely, the portion through which the spin-polarized current flows). For further improving the heat radiation efficiency, it is preferable that the upper interconnection 21 is provided opposed to the whole of the magnetic recording layer 2. Such arrangement increases the area opposed to the magnetic recording layer 2 and effectively improves the heat radiation efficiency of the upper interconnection 21.

SEVENTH EXAMPLE

Figure 11A:
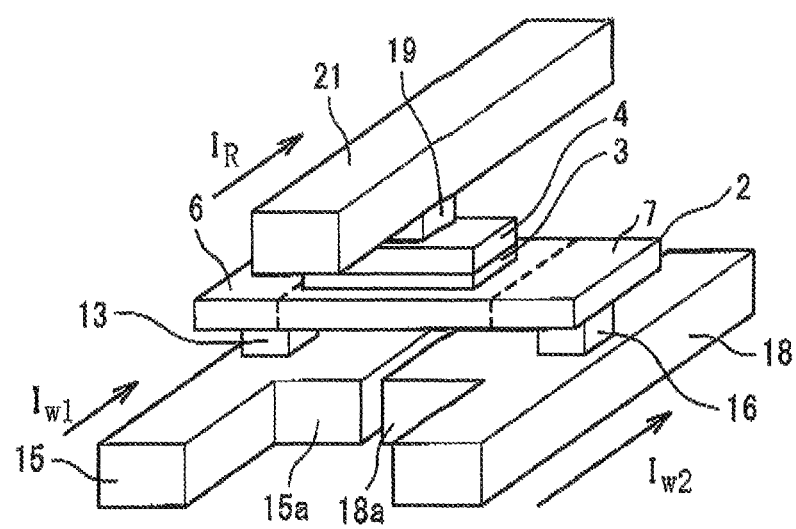
FIG. 11A is a perspective view showing the structure of an MRAM in a seventh example.

FIG. 11A is a perspective view showing the structure of an MRAM in a seventh example. In the MRAM of the sixth example, the lower interconnections 15 and 18 are shaped to function as heat sink structures. That is, the lower interconnection 15 is provided with a protrusion 15a that protrudes in the direction (the x-axis direction in the seventh example) vertical to the extension direction thereof (the y-axis direction in the seventh example), and the lower interconnection 18 is provided with a protrusion 18a that protrudes in the direction vertical to the extension direction thereof. The protrusions 15a and 18a are shaped to be opposed to the top surface of the magnetic recording layer 2. The lower interconnections 15 and 18 with such shapes effectively function as heat sink structures, effectively radiating the heat generated in the magnetic recording layer 2. The structure in which the lower interconnections 15 and 18 function as the heat sink structures does not require an interconnection layer dedicated for the formation of the heat sink structures, allowing the manufacture of the MRAM with a reduced number of interconnection layers. In the such-structured MRAM of the seventh example, read and write operations are carried out similarly to those of the MRAM in the first example.

Figure 11B:
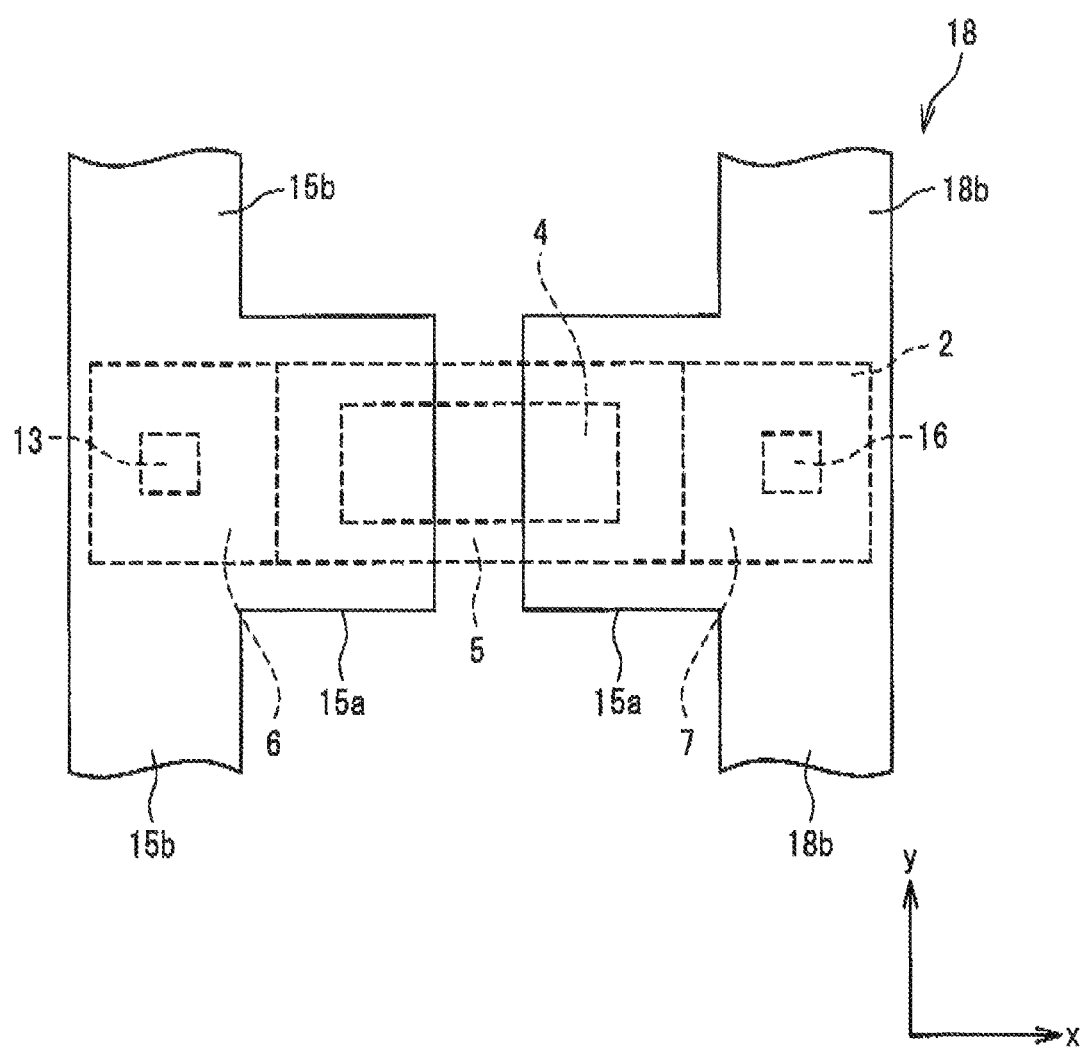
FIG. 11B is a plan view showing the structure of the MRAM in the seventh example.

Preferably, the lower interconnections 15 and 18 are arranged in a shape and arrangement which maximize the area opposed to the magnetic recording layer 2. FIG. 11B is a plan view showing preferable shapes of the lower interconnections 15 and 18. An interconnection main body 15b of the lower interconnection 15 is provided to extend in the y-axis direction (the direction through which the write current $IW_1$ flows), and the protrusion 15a is formed to protrude in the x-axis direction from the interconnection main body 21b. Similarly, an interconnection main body 18b of the lower interconnection 18 is formed to extend in the y-axis direction (the direction through which the write current $IW_2$ flows), and the protrusion 18a is formed to protrude in the x-axis direction from the interconnection main body 18b.

The protrusion 15a is preferably formed so that the lower interconnection 15 is opposed at least to the whole of the magnetization fixed region 6 of the magnetic recording layer 2 and the protrusion 18a is preferably formed so that the lower interconnection 18 is opposed at least to the whole of the magnetization fixed region 7 of the magnetic recording layer 2. Such arrangement increases the area in which the lower interconnections 15 and 18 are opposed to the magnetic recording layer 2 and effectively improves the heat radiation efficiency.

Preferably, the protrusions 15a and 18a are arranged so that the lower interconnections 15 and 18 are opposed to at least a portion of the magnetization free region 5 of the magnetic recording layer 2. It is more preferable that the lower interconnections 15 and 18 are arranged to be opposed to at least a portion of the bottom surface of the magnetization fixed layer 4 (the surface coupled with to the tunnel barrier layer 3). FIG. 11B shows an arrangement in which the lower interconnections 15 and 18 are each opposed to a portion of the bottom surface of the magnetization fixed layer 4. The protrusions 15a and 18a are preferably spaced across a narrow spacing, and most preferably, the protrusions 15a and 18a are spaced by the same interval as the minimal pitch of the design rule of the MRAM.

EIGHTH EXAMPLE

Figure 12A:
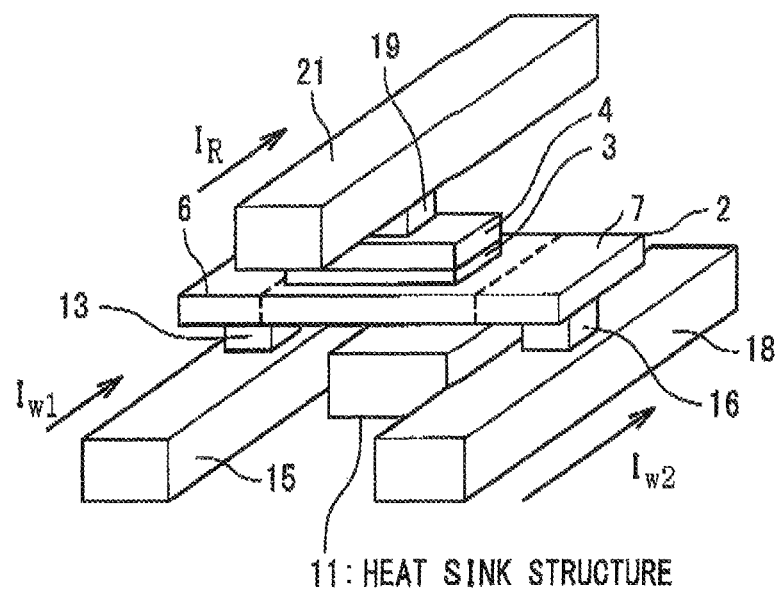
FIG. 12A is a perspective view showing the structure of an MRAM in an eighth example.

FIG. 12A is a perspective view showing the structure of an MRAM in an eighth example. In the MRAM of the eighth example, the heat sink structure 11, which is opposed to the bottom surface of the magnetic recording layer 2, is formed within the same interconnection layer as the lower interconnections 15 and 18. The heat sink structure 11 is formed between the lower interconnections 15 and 18 and electrically isolated from the lower interconnections 15 and 18. The structure in which the heat sink structure 11 is formed within the same interconnection layer as the lower interconnections 15 and 18 preferably eliminates the need for the step for the formation of the heat sink structure.

Figure 12B:
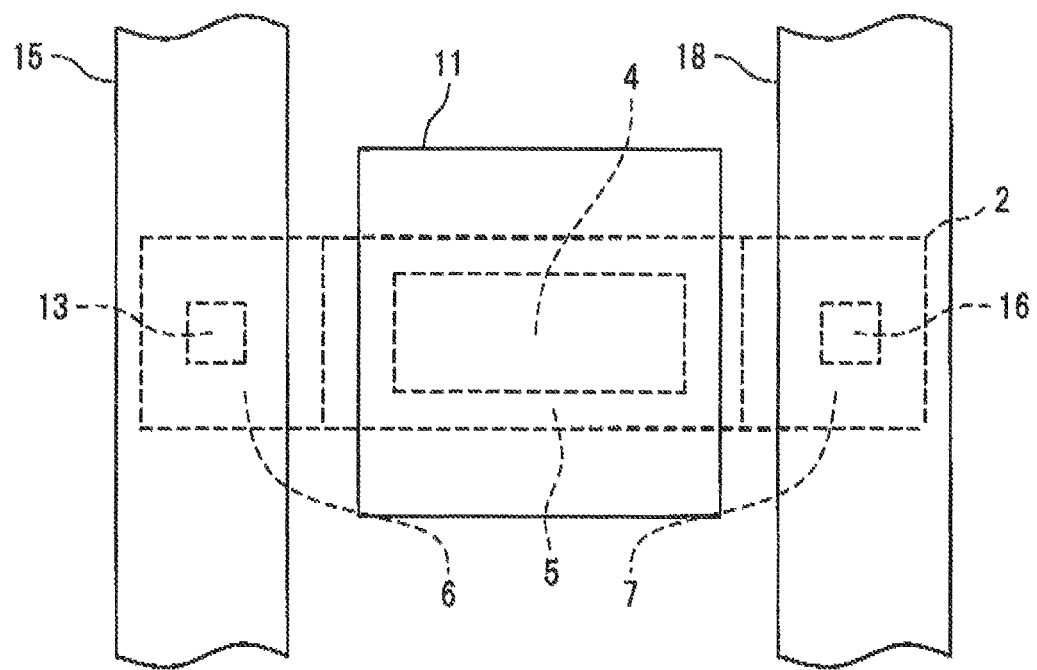
FIG. 12B is a plan view showing the structure of the MRAM in the eighth example.

Preferably, the heat sink structure 11 is arranged in a shape and arrangement that maximize the area opposed to the magnetic recording layer 2. For this purpose, as shown in FIG. 12B, it is preferable that the heat sink structure 11 is formed to traverse the magnetic recording layer 2.

In addition, in order to maximize the area opposed to the magnetic recording layer 2, it is preferable that the lower interconnection 15 and the heat sink structure 11 are spaced by the same interval as the minimal pitch of the design rule of the MRAM. Correspondingly, it is preferable that the lower interconnection 18 and the heat sink structure 11 are spaced with separated at the same interval as the minimal pitch of the design rule of the MRAM.

NINTH EXAMPLE

Figure 13A:
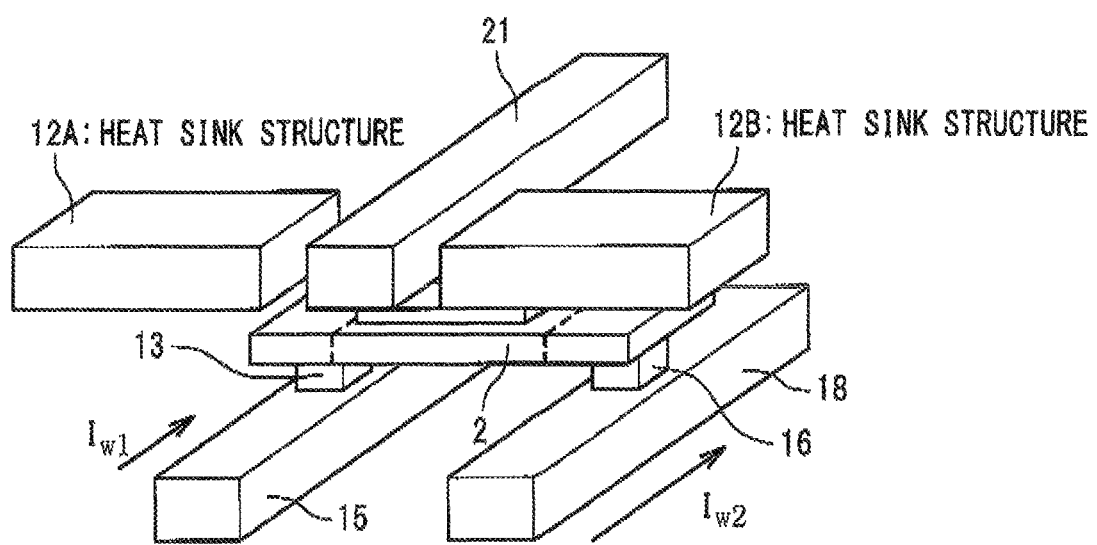
FIG. 13A is an perspective view showing the structure of an MRAM in a ninth example.

FIG. 13A is a perspective view showing the structure of an MRAM in an eighth example. In the MRAM in the eighth example, heat sink structures 12A and 12B, which are opposed to the top surface of the magnetic recording layer 2, are formed within the same interconnection layer as the upper interconnection 21. The heat sink structures 12A and 12B are electrically isolated from the upper interconnection 21. The structure in which the heat sink structures 12A and 12B are formed within the same interconnection layer as the upper interconnection 21 preferably eliminates the need for additional steps for the formation of the heat sink structures.

Figure 13B:
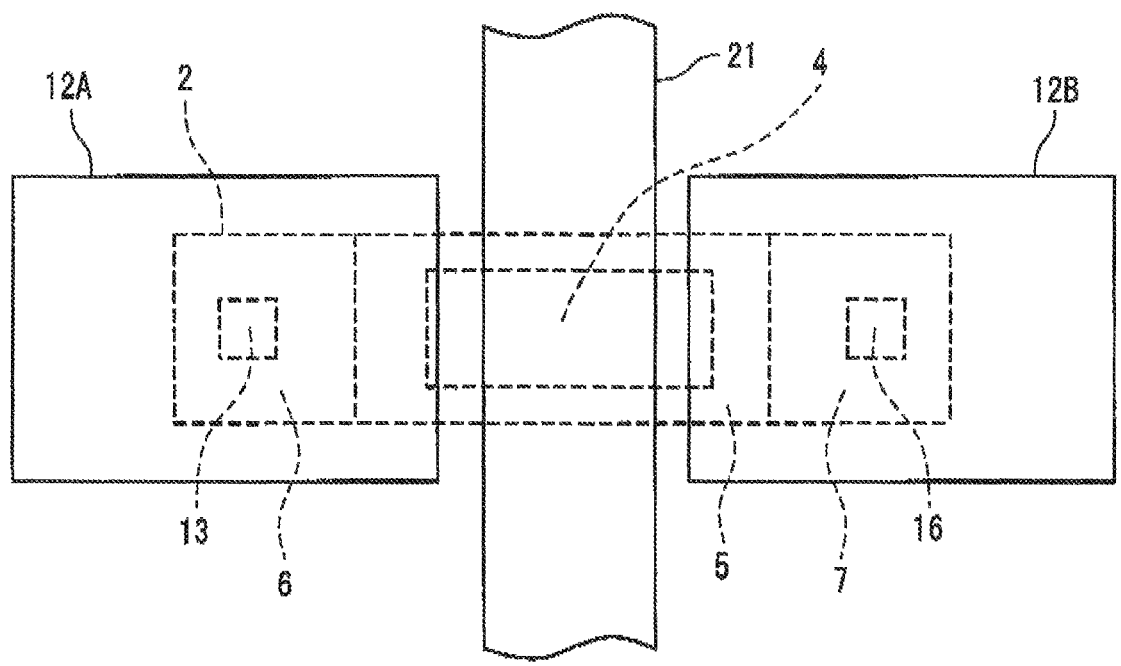
FIG. 13B is a plan view showing the structure of the MRAM in the ninth example.

Preferably, the heat sink structures 12A and 12B are arranged in a shape and arrangement that maximize the area opposed to the magnetic recording layer 2. In order to maximize the area opposed to the magnetic recording layer 2, as shown in FIG. 13B, it is preferable that the heat sink structures 12A and 12B are arranged to be opposed to at least a portion of the magnetization free region 5 in the magnetic recording layer 2; it is further preferable that the heat sink structures 12A and 12B are arranged to be opposed to at least a portion of the top surface of the magnetization fixed layer 4 (the surface coupled with the tunnel barrier layer 3). FIG. 13B shows an arrangement in which the heat sink structures 12A and 12B are each opposed to a portion of the top surface of the magnetization fixed layer 4. It is preferable that the interval between the upper interconnection 21 and the heat sink structure 12A is narrow, and it is most preferable that the upper interconnection 21 and the heat sink structure 12A are separated by the same interval as the minimal pitch of the design rule of the MRAM. Correspondingly, it is preferable that the upper interconnection 21 and the heat sink structure 12B are separated by the same interval as the minimal pitch of the design rule of the MRAM.

Although the first to ninth examples provide the MRAMs that includes only one of a heat sink structure opposed to the top surface of the magnetic recording layer 2 and a heat sink structure opposed to the bottom surface thereof, it is preferable that the MRAM includes both of the heat sink structure opposite to the top surface of the magnetic recording layer 2 and the heat sink structure opposite to the bottom surface, in order to further improve the heat radiation efficiency. In detail, it is preferable that an MRAM adopts both of the arrangement of the heat sink structure shown in one of FIG. 5A, FIG. 6, FIG. 8, FIG. 11A and FIG. 12A and the arrangement of the heat sink structure shown in one of FIG. 7A, FIG. 9A to FIG. 9C, FIG. 10A and FIG. 13A.

The invention claimed is:

1. A magnetic random access memory comprising:
   a magnetic recording layer including a magnetization free region having a reversible magnetization, through which layer a write current is flown in an in-plane direction, said magnetic recording layer comprising,
      a first magnetization fixed region coupled with a first boundary of said magnetization free region and having a fixed magnetization, and
      a second magnetization fixed region coupled with a second boundary of said magnetization free region and having
   a fixed magnetization;
   a magnetization fixed layer having a fixed magnetization;
   a non-magnetic layer provided between said magnetization free region and said magnetization fixed layer; and
   a heat sink structure provided to be opposed to said magnetic recording layer and having a function of receiving and radiating heat generated in said magnetic recording layer;
   a first interconnection electrically connected with said first magnetization fixed region; and
   a second interconnection electrically connected with said second magnetization fixed region,
   wherein said write current is flown from said first magnetization fixed region to said second magnetization fixed region or from said second magnetization fixed region to said first magnetization fixed region, and
   wherein said heat sink structure is positioned between said first and second interconnections within the same interconnection layer as said first and second interconnections.

2. The magnetic random access memory of claim 1, wherein said heat sink structure is electrically isolated from said first and second interconnections.

3. The magnetic random access memory of claim 1, further comprising first and second via contacts that are not part of said heat sink structure,
   wherein said first interconnection is connected to said first magnetization fixed region through said first via contact, and said second interconnection is connected to said second magnetization fixed region through said second via contact.

* * * * *